US009697318B2

(12) United States Patent
Hutton et al.

(10) Patent No.: US 9,697,318 B2
(45) Date of Patent: Jul. 4, 2017

(54) STATE VISIBILITY AND MANIPULATION IN INTEGRATED CIRCUITS

(71) Applicant: Altera Corporation, San Jose, CA (US)

(72) Inventors: Michael Hutton, Mountain View, CA (US); Sean Atsatt, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 14/879,089

(22) Filed: Oct. 8, 2015

(65) Prior Publication Data
US 2017/0103157 A1   Apr. 13, 2017

(51) Int. Cl.
*G06F 17/50* (2006.01)
(52) U.S. Cl.
CPC ...... *G06F 17/5068* (2013.01); *G06F 17/5027* (2013.01)
(58) Field of Classification Search
CPC ... G06F 9/5011; G06F 9/5016; G06F 17/5054
USPC ........................................................ 716/116
See application file for complete search history.

(56) References Cited

U.S. PATENT DOCUMENTS

| 5,036,473 A | 7/1991 | Butts et al. |
| 5,448,496 A | 9/1995 | Butts et al. |
| 5,910,732 A * | 6/1999 | Trimberger ...... H03K 19/17736 326/38 |
| 6,037,800 A * | 3/2000 | Trimberger ...... H03K 19/17736 326/38 |
| 6,041,387 A * | 3/2000 | Fleck et al. ......... G06F 9/30032 711/100 |
| 6,240,376 B1 | 5/2001 | Raynaud et al. |
| 6,336,087 B2 | 1/2002 | Burgun et al. |
| 6,480,019 B2 | 11/2002 | Waldie et al. |
| 6,850,880 B1 | 2/2005 | Beausoleil et al. |
| 7,078,929 B1 | 7/2006 | Draper et al. |
| 7,345,502 B1 | 3/2008 | Lakkapragada et al. |
| 7,496,743 B1 * | 2/2009 | Salazar et al. ............ G06F 9/50 713/1 |

(Continued)

OTHER PUBLICATIONS

U.S. Appl. No. 14/460,548, entitled "Programmable Circuit Having Multiple Sectors."

(Continued)

*Primary Examiner* — Sun Lin

(57) ABSTRACT

In a first mode, a control circuit generates a circuit design implementation with storage circuits in an integrated circuit by programming configuration memory bits via configuration resources. The storage circuits can be accessed for read and write operations during the execution of the circuit design implementation with the integrated circuit. In a second mode, the control circuit can perform read and write access operations at the storage circuits via configuration resources or via an interface circuit and interconnect resources that are allocated to the circuit design implementation. Typical applications for performing access operations at the storage circuits include fault injection and observation, statistical monitoring of the circuit design, initialization and distribution of certain signals including reset signals, event sampling, just to name a few.

20 Claims, 8 Drawing Sheets

(56) References Cited

U.S. PATENT DOCUMENTS

| | | | |
|---|---|---|---|
| 7,657,673 B2* | 2/2010 | Ueda | G06F 13/385 |
| | | | 345/539 |
| 7,746,099 B1 | 6/2010 | Chan et al. | |
| 7,747,165 B2* | 6/2010 | Emery et al. | H04J 14/0227 |
| | | | 398/25 |
| 8,447,850 B2* | 5/2013 | Moriyasu et al. | G06F 9/5077 |
| | | | 709/223 |
| 8,689,068 B2 | 4/2014 | Jain et al. | |
| 9,183,055 B2* | 11/2015 | Beckmann et al. | G06F 9/5011 |
| 2008/0263319 A1 | 10/2008 | Snyder et al. | |
| 2014/0126572 A1 | 5/2014 | Hutton et al. | |

OTHER PUBLICATIONS

U.S. Appl. No. 14/611,031 entited "Circuit Design Instrumentation for State Visualization," filed Jan. 30, 2015.
U.S. Appl. No. 14/610,341 entited "Techniques for Using Scan Storage Circuits," filed Jan. 30, 2015.
European Patent Office, European Search Report for European Patent Application EP 16 19 2391, Mar. 29, 2017.

* cited by examiner

STATE VISIBILITY AND MANIPULATION IN INTEGRATED CIRCUITS

TECHNICAL FIELD

The embodiments presented herein relate to electronic circuits and, more particularly, to techniques for accessing storage circuits in an integrated circuit.

BACKGROUND

Storage circuits are often used to hold a state in an integrated circuit, and write access to these storage circuits before the execution of a user application is usually required, for example as part of initializing a computation. Consider a programmable logic device (PLD) as one example of an integrated circuit. Configuring the PLD to implement a given circuit design involves programming configuration memory elements by writing data to storage circuits. Furthermore, storage circuits are often required to be in an initial state before the integrated circuit begins to operate. For example, conditions on storage circuits often set the starting point of a computation (e.g., reset a counter to zero) or store coefficients for computations (e.g., for finite impulse response (FIR) filters).

Read access to these storage circuits that is independent of the execution of a user application during the operation of the integrated circuit plays an equally important role. For example, applications involving debug operations such as observing the state of the integrated circuit to determine the correctness of an operation, using the integrated circuit for the purpose of emulating a circuit design, or monitoring the integrated circuit for defects or the occurrence of error conditions such as single event upsets (SEU) often require the extraction of the state of storage circuits in the integrated circuit.

SUMMARY

According to some embodiments, a control circuit in a first mode may generate a circuit design implementation with an integrated circuit by programming configuration memory bits via configuration resources. The circuit design implementation may include a storage circuit. During the operation of the integrated circuit with the circuit design implementation, the circuit design implementation may perform a first access operation at the storage circuit. The control circuit in a second mode may perform a second access operation at the storage circuit via the configuration resources in a second mode. In some embodiments, the second access operation is a write operation. In other embodiments, the second access operation is read operation.

It should be appreciated that the present invention can be implemented in numerous ways, such as a process, an apparatus, a system, a device, or a method on a computer readable medium. Several embodiments of the present invention are disclosed herein.

In certain embodiments, the above-mentioned write operation may inject a fault into the circuit design implementation by inverting a bit in the storage circuit. The impact of the fault injection may include observing an output of the integrated circuit to examine whether the fault affects the output.

If desired, the write operation may further include receiving a reset signal at the control circuit, performing an interrupt operation at the control circuit upon reception of the reset signal, and sending a reset request signal from the control circuit to a sector via the configuration resources, wherein the reset request signal requests performing a reset operation in the sector.

Further features of the present invention, its nature and various advantages, will be more apparent from the accompanying drawings and the following detailed description of the preferred embodiments.

DETAILED DESCRIPTION

Figure 1:
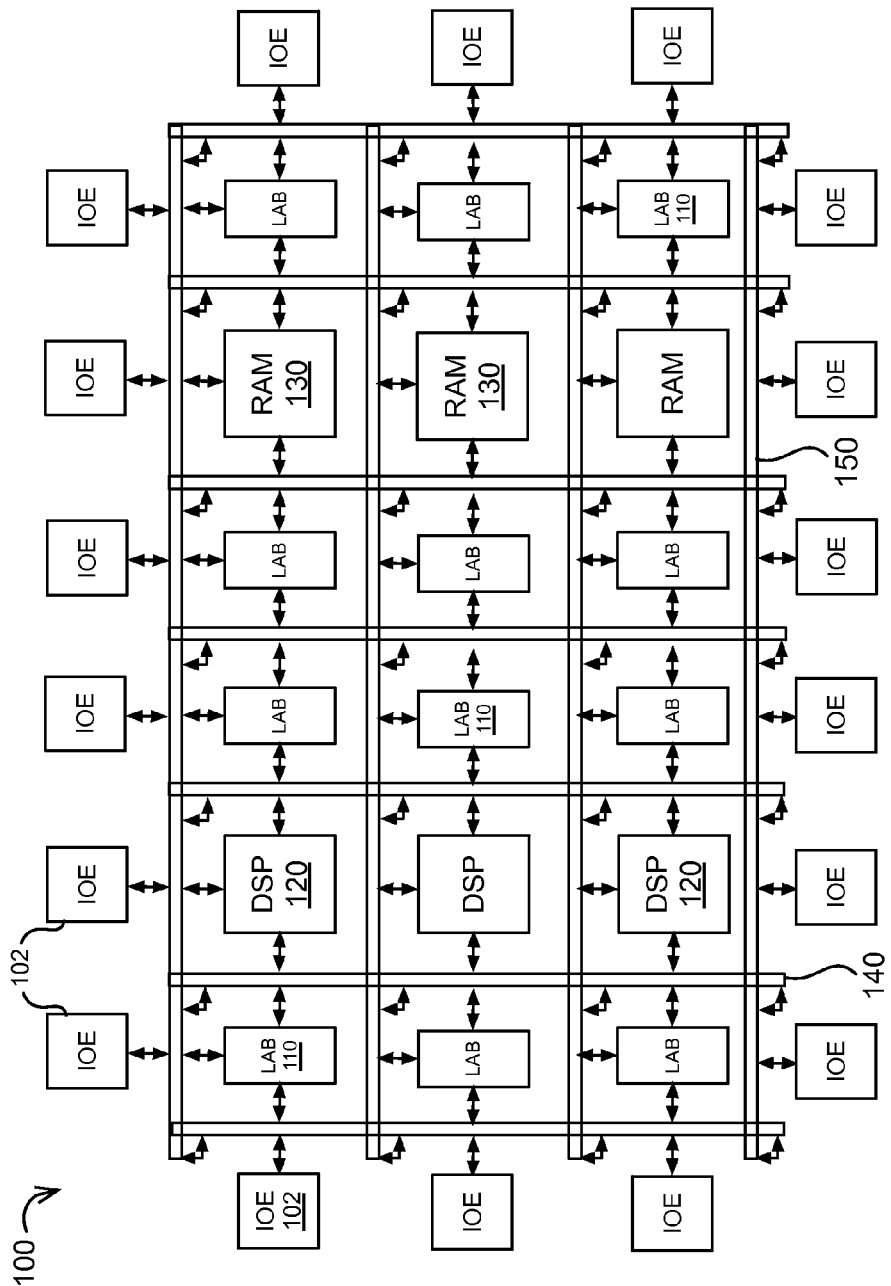
FIG. 1 is a diagram of an illustrative integrated circuit in accordance with an embodiment.

An integrated circuit may implement a circuit design, which is sometimes also referred to as an application or a user application. The circuit design implementation may include logic circuits (e.g., logic AND gates, logic OR gates, inverters, etc.), storage circuits (e.g., registers, latches, memories, etc., arithmetic circuits (e.g., adders, subtractors, multipliers, dividers, etc.), input circuits (e.g., input ports, receiver circuits, memory interfaces, etc.), output circuits (e.g., output ports, transmitter circuits, memory interfaces, etc.).

The storage circuits in the integrated circuit are often used to store a state of the circuit design implementation. The circuit design implementation may perform read access operations to retrieve data signals from these storage circuits and/or write access operations to store data signals in these storage circuits during the operation of the integrated circuit. In some cases, it may be desirable to perform at least some of the read access and/or write access operations independently of the application that the integrated circuit executes during operation.

For example, write access operations that are performed independently of the execution of the application may include write access operations that occur before the execution of the application (e.g., initializing a computation by resetting a counter to zero or setting constant coefficient values, putting state machines into an initial state, programming configurable circuitry, etc.), partial reconfiguration, setting the application into a known state for debugging purposes, single-event upset (SEU) correction, etc.

As another example, read access operations that are performed independently of the execution of the application may include debug operations such as observing the state of the integrated circuit to determine the correctness of an operation, using the integrated circuit for the purpose of emulating a circuit design, monitoring the integrated circuit for defects or the occurrence of error conditions such as single event upsets (SEU), etc.

If desired, the value of the data retrieved from the storage circuits may be routed through debug ports such as the Internal Configuration Access Port (ICAP), the Joint Test Action Group (JTAG) ports, or other output ports to embedded processor circuits or other possible recipients for further analysis outside the integrated circuit.

Current solutions for performing read and/or write access operations independently of the execution of the application (e.g., SignalProbe or the SignalTap®II Logic Analyzer sold by Altera Corporation of San Jose, Calif. or the Chipscope™Pro software sold by Xilinx Incorporated of San Jose, Calif.) have numerous drawbacks. For example, read access operations for the purpose of retrieving the state of the integrated circuit are often slow compared to the execution of the application and generally require the execution of the application to be stopped. Some storage circuits may not be directly accessible and therefore be unobservable during read access operations and not writable during write access operations. The timing and resource utilization of the application may be affected by adding debug connections to probe signals at connections inside the circuit design implementation and/or allocating an internal trace buffer. In addition, the connections at which signals are probed are often required to be known before the execution of the application so that they may be included in the circuit design implementation.

It will be recognized by one skilled in the art, that the present exemplary embodiments may be practiced without some or all of these specific details. In other instances, well-known operations have not been described in detail in order not to unnecessarily obscure the present embodiments.

An illustrative embodiment of an integrated circuit such as programmable integrated circuit 100 that may be configured to implement a circuit design is shown in FIG. 1. As shown in FIG. 1, the programmable integrated circuit 100 may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

In addition, the programmable integrated circuit 100 may have input/output elements (IOEs) 102 for driving signals off of programmable integrated circuit 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable integrated circuit 100 may have input/output elements 102 arranged in different ways. For example, input/output elements 102 may form one or more columns of input/output elements that may be located anywhere on the programmable integrated circuit 100 (e.g., distributed evenly across the width of the programmable integrated circuit). If desired, input/output elements 102 may form one or more rows of input/output elements (e.g., distributed across the height of the programmable integrated circuit). Alternatively, input/output elements 102 may form islands of input/output elements that may be distributed over the surface of the programmable integrated circuit 100 or clustered in selected areas.

The programmable integrated circuit 100 may also include programmable interconnect circuitry in the form of vertical routing channels 140 (i.e., interconnects formed along a vertical axis of programmable integrated circuit 100) and horizontal routing channels 150 (i.e., interconnects formed along a horizontal axis of programmable integrated circuit 100), each routing channel including at least one track to route at least one wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of programmable integrated circuit 100, fractional global wires such as wires that span part of programmable integrated circuit 100, staggered wires of a particular length, smaller local wires, or any other suitable interconnection resource arrangement.

Furthermore, it should be understood that embodiments may be implemented in any integrated circuit.

If desired, the functional blocks of such an integrated circuit may be arranged in more levels or layers in which multiple functional blocks are interconnected to form still larger blocks. Other device arrangements may use functional blocks that are not arranged in rows and columns.

Programmable integrated circuit 100 may contain programmable memory elements. Memory elements may be loaded with configuration data (also called programming data) using input/output elements (IOEs) 102 and configuration resources. Once loaded, the memory elements each provide a corresponding static control signal that controls the operation of an associated functional block (e.g., LABs 110, DSP 120, RAM 130, input/output elements 102, or interconnect resources that create a signal path).

In a typical scenario, the outputs of the loaded memory elements are applied to the gates of metal-oxide-semiconductor field-effect transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), combinations of these structures, etc. Because the memory elements are loaded with configuration data during programming, the memory elements are sometimes referred to as configuration memory elements, configuration RAM (CRAM), or programmable memory elements.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory bits of the row that was designated by the address register.

In certain embodiments, programmable integrated circuit 100 may include configuration memory that is organized in sectors, whereby a sector may include the configuration RAM bits that specify the function and/or interconnections of the subcomponents and wires in or crossing that sector. Each sector may include separate data and address registers. Further information on sectors can be found in commonly-owned U.S. patent application Ser. No. 14/460,548, entitled "Programmable Circuit Having Multiple Sectors," which is hereby incorporated by reference herein in its entirety.

Figure 2:
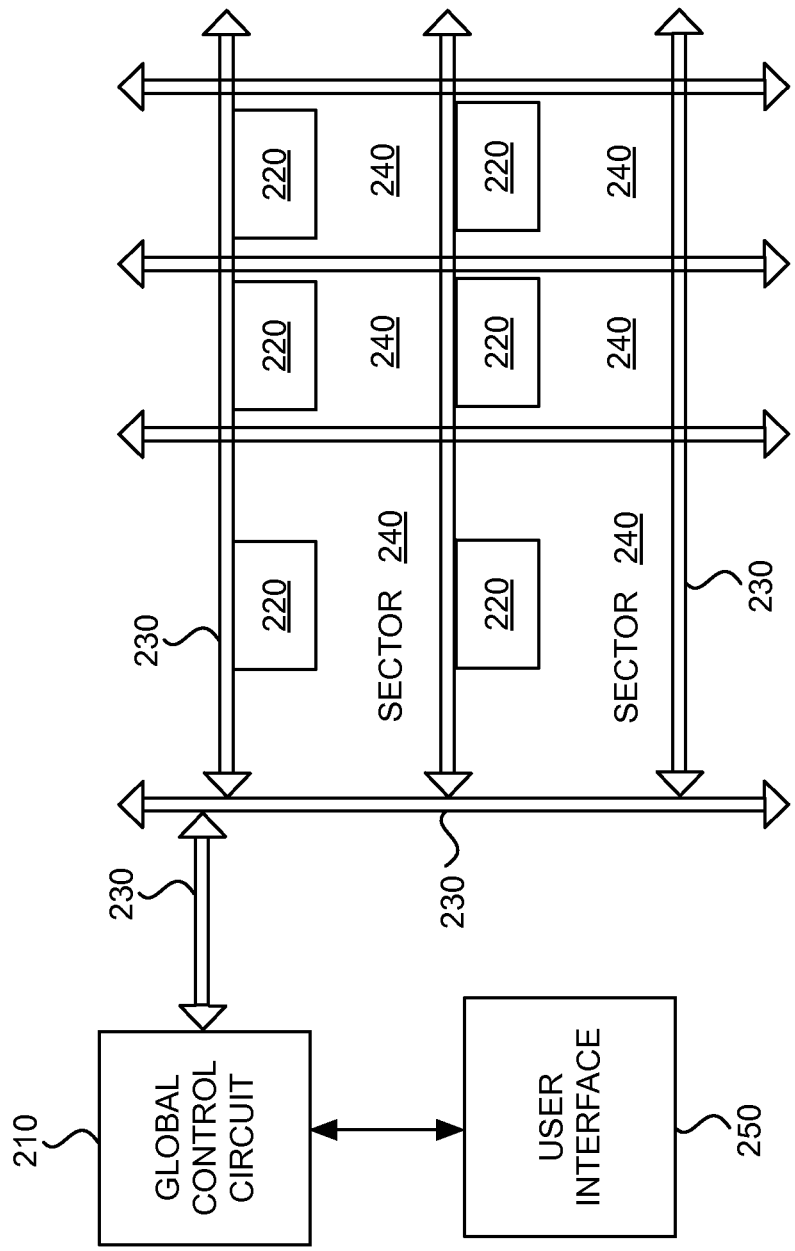
FIG. 2 is a diagram of illustrative circuitry for accessing storage circuits with a user interface and a global control circuit that controls multiple sectors over configuration resources in accordance with an embodiment.

FIG. 2 shows an illustrative configurable integrated circuit such as programmable integrated circuit 100 with configuration memory that is organized in sectors 240. Each sector 240 may include a local control circuit 220. These local control circuits may control the clock distribution networks and the configuration of the respective sectors 240. If desired, local control circuits 220 may manipulate and observe scan chains inside the respective sectors 240.

In certain embodiments, the local control circuits 220 may be implemented as state machines. In certain embodiments, the local control circuits 220 may be implemented as minimal processors. Each operation supported by local control circuits 220 may be implemented as a separate routine in a memory containing a control program.

In certain embodiments, this control program memory may receive and store new routines in order to implement new operations and functionality into the sectors. These new operations may increase the local activity within the sector. Without this extensibility, new functionality may need to be implemented in terms of pre-existing operations, which may increase the needed amount of communication between the global and local control circuits and prevent fully parallel use of the local control circuits 220.

Communication network 230 may connect local control circuits 220 to a global control circuit 210. For example, communication network 230 may be used to transport configuration and/or debug data for configuration and/or debug purposes, respectively. In some embodiments, communication network 230 may be used to transport data signals as part of a circuit design implementation. If desired, communication network 230 may be implemented as a mesh-based network-on-chip (NoC). Further information on Networks-on-Chip and FPGAs can be found in commonly-owned U.S. Patent Application Publication No. 2014/0126572, "Programmable Logic Device with Integrated Network-on-Chip," which is hereby incorporated by reference herein in its entirety.

Global control circuit 210 may connect to device pins through which it can communicate with user interface 250. User interface 250 may include, for example, a JTAG scan chain, input/output ports, programmable logic circuits, or any combination of these circuits. Global control circuit 210 may receive commands from user interface 250, process the received commands, and send the processed commands to local control circuits 220 as required through communication network 230. In response to receiving commands from global control circuit 210, the local control circuits 220 may orchestrate the reading of the storage circuits in the respective sectors 240 and then send the data retrieved from the storage circuits back over communication network 230 to global control circuit 210.

Because global control circuit 210 is responsible for, among other things, coordinating the operations of the local control circuits 220, for communication between user interface 250 and the local control circuits 220, and for security features, global control circuit 210 (or at least a portion thereof) may be implemented in a processor as well. The processor may be a dedicated processor, special boot-up code for a user-visible processor already included in the device's design, or another suitable arrangement.

An advantage of the division into sectors may be that the local control circuits 220 may operate independently and in parallel. Each local control circuit 220 may retrieve data from its respective sector 240 using one or more scan chains in its respective sector 240, as disclosed in further detail below or through an interface with the data register that includes a data register controller. In some embodiments, each of local control circuits 220 can filter the data retrieved from its respective sector 240 to a reduced set of data after discarding unneeded data. The local control circuits 220 may then transmit the reduced sets of data over communication network 230 to global control circuit 210.

If each local control circuit 220 transmits data over communication network 230 at less than the maximum bandwidth of network 230, global control circuit 210 may determine a schedule for the local control circuits 220 to interleave data that is transmitted over network 230.

Alternatively, global control circuit 210 may offer a timing schedule that allows the local control circuits 220 to transmit data over network 230 serially at the full bandwidth of network 230.

Global control circuit 210 may communicate with user interface 250 at a high data rate (e.g., through a high-speed serial interface (HSSI) transceiver circuit for example using the 10 Gigabit Ethernet protocol or the Peripheral Component Interconnect Express (PCIe) protocol, to name a few). Global control circuit 210 may communicate with the local control circuits 220 through a time-multiplexed communication network 230, for example, with each of the local control circuits 220 operating at a comparably lower rate but in parallel.

Each of the local control circuits 220 can monitor a first set of storage circuits in its respective sector 240 during a first time period, and a second set of storage circuits in its respective sector 240 during a second time period. The local control circuit's control program may be dynamically extended to perform this monitoring function. This monitoring function allows the set of storage circuits monitored at some point in time to be much larger than the number of bits sent from the sector over communication network 230 and global control circuit 210 to user interface 250 for external monitoring and interpretation. In addition, fixing a bug in a circuit design that requires altering the design implementation on the configurable integrated circuit (e.g., changing a logic AND to a logic OR) may require a local change that can be brought about using partial reconfiguration of the sector.

Figure 3:
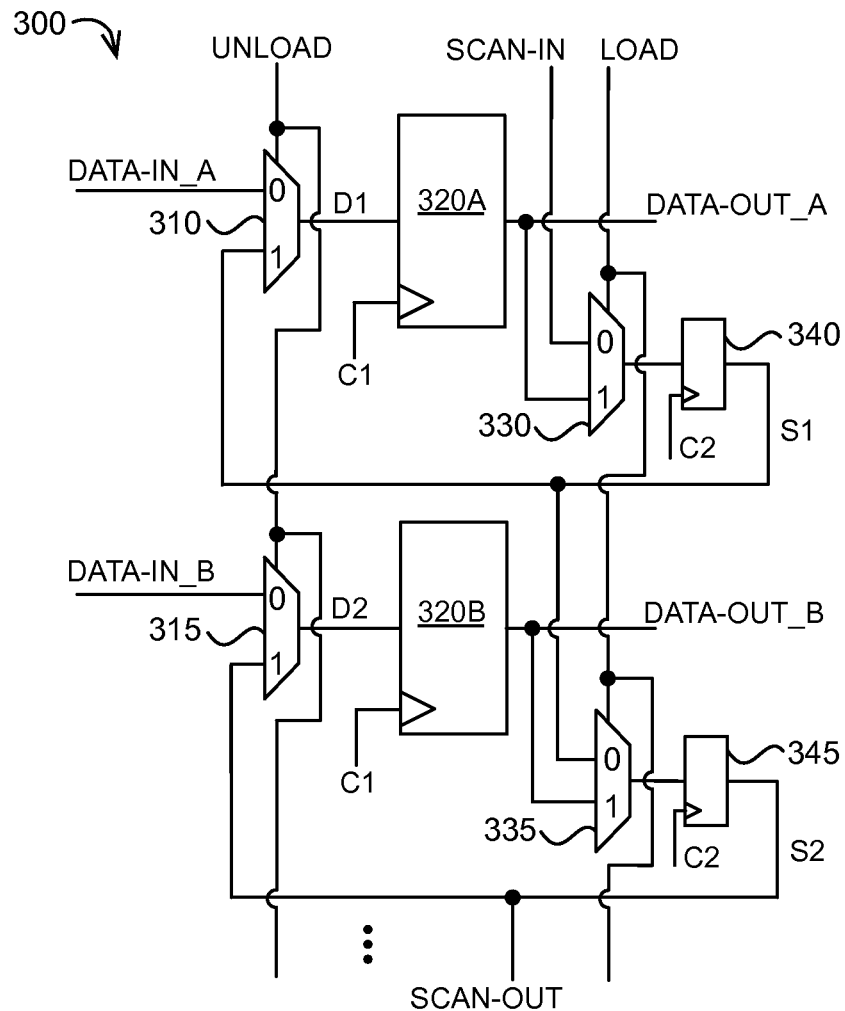
FIG. 3 is a diagram of an illustrative circuit that enables state capturing of storage circuits using a scan chain in accordance with an embodiment.
Figure 3:
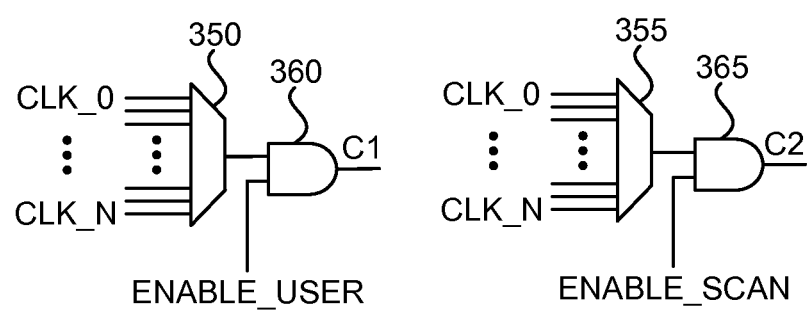

The independence of the sectors 240 may also result in shorter scan chains that are entirely contained within one sector and controlled by the respective local control circuit 220. In certain embodiments, the information about the states of storage circuits may be retrieved using scan chains. FIG. 3 shows an illustrative circuit 300 that enables state capturing and state restoration of user storage circuits (e.g., user registers) using scan storage circuits (e.g., scan registers) that are arranged in a scan chain. Because user storage circuits 320A and 320B are accessible using scan storage circuits without traversing other storage circuits, user storage circuits 320A and 320B may be referred to as observable storage circuits.

As shown in FIG. 3, the scan chain includes scan storage circuit 340 and scan storage circuit 345. Multiplexers 330 and 335 couple together scan storage circuits 340 and 345 as a shift register in the scan chain when signal LOAD is '0.' The scan chain that includes scan storage circuits 340 and 345 is a dedicated scan chain that is used to capture and shift out data stored in user storage circuits 320A and 320B without shifting additional data into user storage circuits 320A and 320B. Thus, the scan chain that includes scan storage circuits 340 and 345 can perform a non-destructive capture of the data stored in user storage circuits 320A and 320B without disturbing or erasing the data stored in user storage circuits 320A and 320B. Non-destructive capture of data stored in user storage circuits is also referred to as a snapshot or as state visualization.

A clock distribution network may use multiplexer 355 to select a clock signal among clock signals CLK_0, CLK_1, . . . CLK_N. Logic AND gate 365 may receive the selected clock signal from multiplexer 355 and signal ENABLE_SCAN, which may enable or disable the selected clock signal. As an example, the output of logic AND gate 365 may be clock signal C2, which may trigger scan storage circuits 340 and 345.

Another clock distribution network may use multiplexer 350 to select a clock signal among clock signals CLK_0, CLK_1, . . . CLK_N. Logic AND gate 360 may receive the selected clock signal from multiplexer 350 and signal ENABLE_USER, which may enable or disable the selected clock signal. As an example, the output of logic AND gate 360 may be clock signal C1, which may trigger user storage circuits 320A and 320B.

In application execution mode (i.e., during the operation of the circuit design implementation), which is sometimes also referred to as user mode, user storage circuits 320A and 320B may receive data signals D1 and D2 from multiplexers 310 and 315, respectively. In this mode, signal UNLOAD may be de-asserted, and multiplexers 310 and 315 may select signals DATA-IN_A and DATA-IN_B as signals D1 and D2, respectively. User storage circuits 320A and 320B may store signals D1 and D2 at triggering events (e.g., rising edge, falling edge, high-level, low-level, or any combination thereof) of clock signal C1, and may provide the values of signals D1 and D2 as signals DATA-OUT_A and DATA-OUT_B, respectively.

If desired, a control circuit (e.g., local control circuit 220 of FIG. 2) may perform a read access operation of the user storage circuits to extract the state of user storage circuits 320A and 320B. For example, the signals stored in user storage circuits 320A and 320B may be retrieved using the scan chain in data retrieval mode. Retrieving the signals stored in user storage circuits 320A and 320B is sometimes also referred to as operating circuit 300 in read-back mode. For this purpose, signals ENABLE_USER and ENABLE_SCAN may be de-asserted to halt clock signals C1 and C2, respectively. Signal LOAD may be set to '1' such that multiplexers 330 and 335 select the signals from user storage circuits 320A and 320B, respectively.

Signal ENABLE_SCAN may be asserted to allow one triggering event of clock signal C2. The one triggering event of clock signal C2 triggers scan storage circuits 340 and 345 to store the values stored in user storage circuits 320A and 320B, respectively. Then, signal LOAD may be switched from '1' to '0' to cause multiplexers 330 and 335 to select signals from other scan storage circuits on the scan chain. For example, multiplexer 335 selects the output signal S1 of scan storage circuit 340. Signal ENABLE_SCAN may then be asserted to start oscillations in clock signal C2. Scan storage circuits 340 and 345 then shift the stored data indicated by signals S1 and S2 out of the scan chain in signal SCAN-OUT at successive triggering events of clock signal C2. In certain embodiments, the values stored in user storage circuits 320A and 320B may be retrieved in read-back mode without halting clock signal C1. For example, signal LOAD and clock signals C1 and C2 may be synchronized such that read-back is possible without halting clock signal C1.

If desired, signal ENABLE_USER may be asserted to start oscillations in clock signal C1. In response to oscillations in clock signal C1, user storage circuits 320A and 320B may operate in design execution mode, while the stored data are retrieved using the scan chain.

In an exemplary embodiment, the scan chain of FIG. 3 does not have direct connections to global routing conductors used to route signals between programmable logic blocks in the integrated circuit. Taking a snapshot of the data stored in the user storage circuits 320A-320B using the dedicated scan chain of FIG. 3 may allow for the removal of a global freeze signal and freeze logic that otherwise would be used to gate the global routing conductors.

In another embodiment, global control circuit 210 or the local control circuits 220 may have security logic that can disable read-back mode. The security logic can cause one or more of sectors 240 to enter a secure mode in which the ability of the scan chains in the respective sectors 240 to take snapshots of the data stored in the user storage circuits is disabled. The security logic can be used to ensure that the states of the user storage circuits that are programmed to be secure cannot be accessed in user mode. The security logic may, for example, be controlled by CRAM settings or fuses.

In another scenario, a control circuit (e.g., local control circuit 220 of FIG. 2) may perform a write access operation of the user storage circuits to set user storage circuits 320A and 320B in a predetermined state. For example, predetermined data may be written to user storage circuits 320A and 320B using the scan chain in data restoration mode. Writing predetermined data to user storage circuits 320A and 320B is sometimes also referred to as operating circuit 300 in write-back mode. For this purpose, signal LOAD may be set to '0' to cause multiplexers 330 and 335 to select signals from other scan storage circuits on the scan chain. Signal ENABLE_SCAN may be asserted to cause the predetermined data to be shifted into the scan chain via signal SCAN-IN. Scan storage circuits 340 and 345 store the predetermined data at their outputs as signals S1 and S2, respectively, in response to successive clock triggering events of clock signal C2.

Next, signals ENABLE_USER and ENABLE_SCAN may be de-asserted to halt clock signals C1 and C2, respectively. Signal UNLOAD may be set to '1' to cause multiplexers 310 and 315 to select the signals S1 and S2 from scan storage circuits 340 and 345 as signals D1 and D2, respectively.

Signal ENABLE_USER may be asserted for one triggering event of clock signal C1. The one triggering event of clock signal C1 may trigger user storage circuits 320A and 320B to store signals D1 and D2, respectively. As a result, user storage circuits 320A and 320B store the predetermined data from scan storage circuits 340 and 345, respectively. Then, signal UNLOAD may be set to '0' to cause multiplexers 310 and 315 to select signals DATA-IN_A and DATA-IN_B as signals D1 and D2, respectively. Signal ENABLE_USER may then be asserted to start clock signal C1, causing user storage circuits 320A and 320B to operate in design execution mode.

Figure 4:
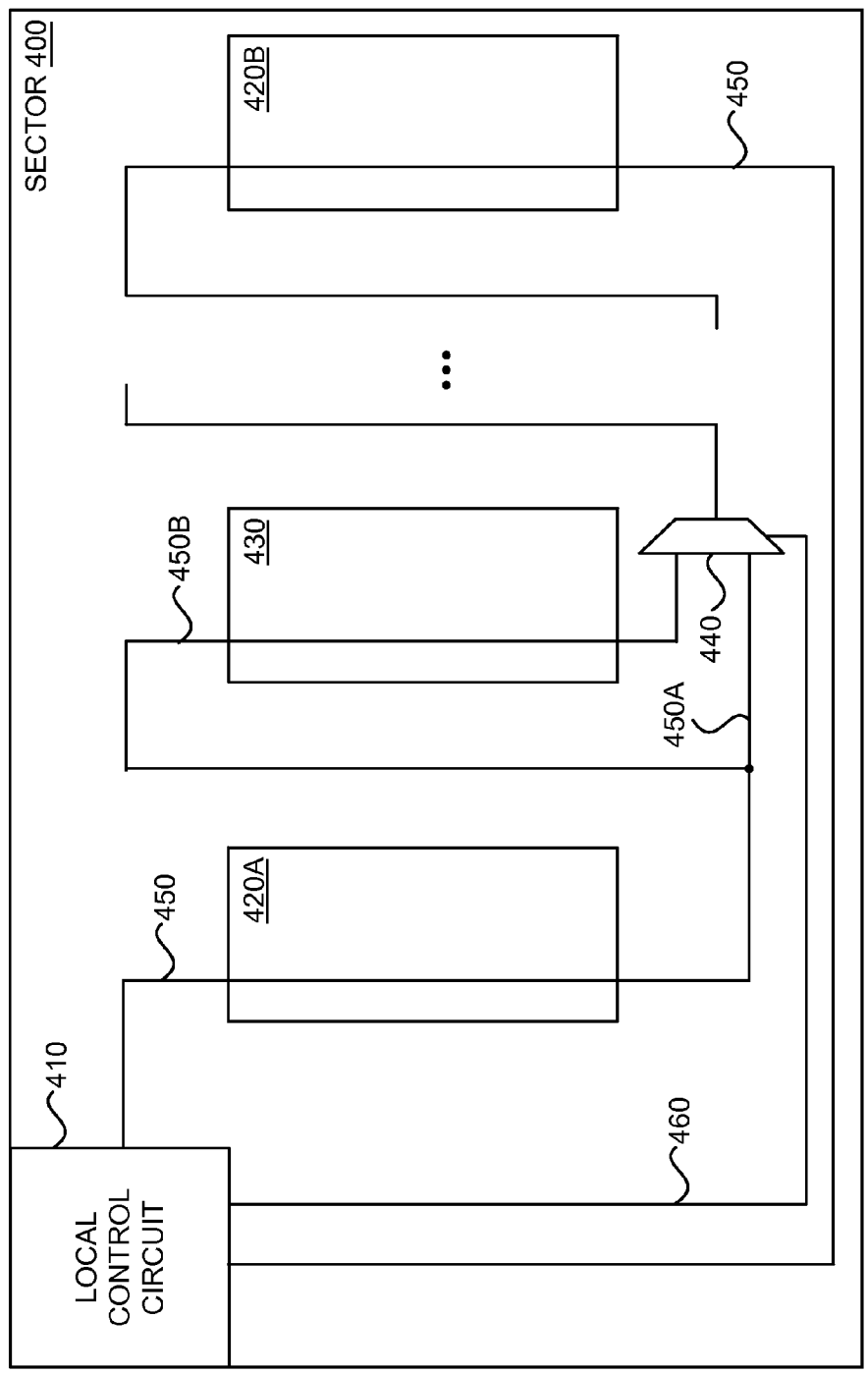
FIG. 4 is a diagram of an illustrative sector with scan chains that are controlled by a local control circuit in accordance with an embodiment.

If desired, a local control circuit (e.g., local control circuit 220 of FIG. 2) may control the scan chain. As an example, the local control circuit may control signals LOAD, UNLOAD, and ENABLE_SCAN. An illustrative embodiment of a sector (e.g., sector 240 of FIG. 2) with a local control circuit that controls a scan chain is shown in FIG. 4. As shown in FIG. 4, a sector 400 may include local control circuit 410, circuit blocks 420 that are of a first type (e.g., one of LAB 110, DSP 120, or RAM 130 of FIG. 1), and circuit blocks 430 of a second type (e.g., a different one of LAB 110, DSP 120, or RAM 130 of FIG. 1) that are different than the circuit blocks 420 of the first type.

Local control circuit 410 may control scan chain 450, which may originate in local control circuit 410, traverse circuit blocks 420A, 430, . . . , and 420B before terminating at local control circuit 410. Scan chain 450 includes portions 450A-450B. Scan chain 450 includes scan storage circuits, such as scan storage circuits 340 and 345. In some embodiments, scan chain 450 includes numerous scan storage circuits. If desired, sector 400 may include more than one scan chain. Each scan chain in sector 400 may originate and terminate in local control circuit 410, and local control circuit 410 may individually control each scan chain in sector 400.

As shown in FIG. 4, local control circuit 410 may control the scan chain 450 using connection 460 and multiplexer 440. For example, local control circuit 410 may direct multiplexer circuit 440 to select the signal on scan chain portion 450A from circuit block 420A at its first multiplexing input, thereby bypassing the scan chain portion 450B from circuit block 430 at its second multiplexing input.

Alternatively, local control circuit 410 may cause multiplexer 440 to select the signal on scan chain portion 450B from circuit block 430. For example, consider the scenario in which local control circuit 410 tests the operability of all storage circuits in sector 400. In this scenario, local control circuit 410 may direct multiplexer 440 to select the signal on scan chain portion 450B at its second multiplexing input.

As another example, consider the scenario in which a user wants to probe the signals stored in circuit blocks 420 using scan chain 450, but not the signals stored in circuit blocks 430. In this scenario, local control circuit 410 may direct multiplexer 440 to select the signal on scan chain portion 450A at its first multiplexing input, bypassing the scan chain portion 450B from circuit block 430.

If desired, local control circuit 410 may be coupled to a global control circuit (e.g., as shown for local control circuit 220 of FIG. 2 that is coupled to global control circuit 210 over network 230). Local control circuit 410 may include filtering capabilities. The filtering capabilities may, for example, allow local control circuit 410 to monitor a subset of storage circuits in one or more of circuit blocks 420 and 430 during a first time period, and to monitor another subset of storage circuits in one or more of circuit blocks 420 and 430 during a second time period.

In embodiments in which local control circuit 410 includes a processor, the processor in local control circuit 410 may perform filtering of captured data using software.

As an example, local control circuit 410 may remove sets of state according to user software code running on the processor. As another example, local control circuit 410 may orchestrate a snapshot of data from storage circuits and perform diagnostic tests to determine whether the snapshot of the data should be abandoned or retained. Local control circuit 410 may, for example, abandon a snapshot once a circuit being tested is determined to be error free.

If desired, local control circuit 410 may individually retrieve data stored in one or more storage circuits, data stored in one or more storage circuits that are located in one or more circuit blocks, or data stored in one or more storage circuits that are coupled to one or more scan chains in sector 400. Local control circuit 410 may retrieve data stored in one or more storage circuits located in an adaptive logic module (ALM) in sector 400, data stored in one or more storage circuits located in a logic array block (LAB) in sector 400, data stored in one or more storage circuits located in a memory element in sector 400, and/or data stored in one or more storage circuits located in a digital signal processor (DSP) block in sector 400. An adaptive logic module (ALM) includes combinatorial logic such as a look-up table. Local control circuit 410 may buffer and/or process the retrieved data. Local control circuit 410 may provide the retrieved data to global control circuit 210 via network 230. Global control circuit 210 may package the retrieved data and transmit the packaged data externally via user interface 250.

Figure 5:
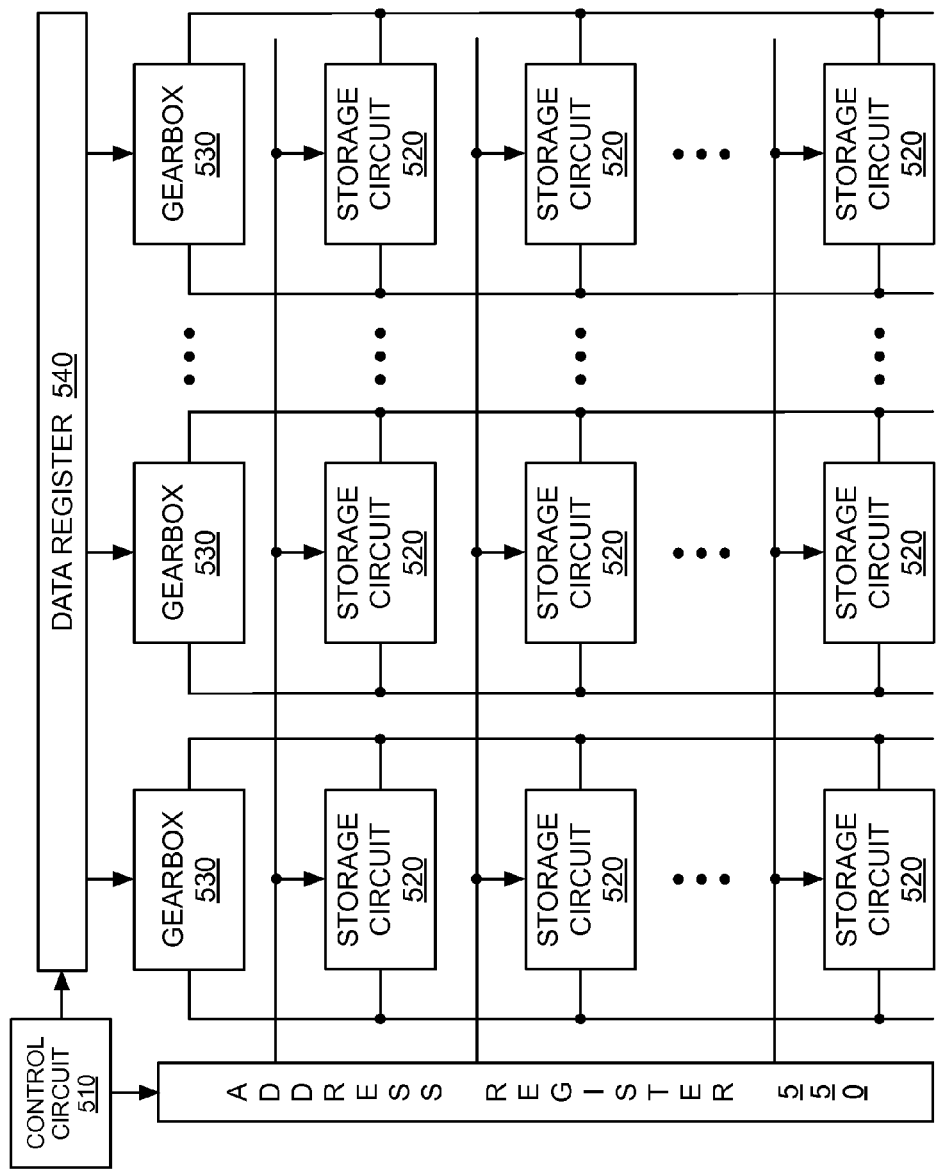
FIG. 5 is a diagram of an illustrative control circuit that performs access operations to an array of storage circuits in accordance with an embodiment.

In certain embodiments, a control circuit may generate a circuit design implementation with an integrated circuit by programming configuration memory bits via configuration resources such as address registers and data registers in a first mode and perform access operations to storage circuits via the configuration resources in a second mode, which is illustrated in FIG. 5. The circuitry of FIG. 5 may include control circuit 510, data register 540, address register 550, gearboxes 530, and storage circuits 520. As shown, storage circuits 520 may be arranged in an array of rows and columns with address register 550 connecting to storage circuits 520 by row and data register 540 connecting via gearboxes 530 to storage circuits 520 by column.

The circuitry of FIG. 5 is merely illustrative and is not intended to limit the scope of the present invention. If desired, the address register may connect to storage circuits by column and the data register by rows, storage circuits 520 may be arranged differently, etc. For example, the circuitry may have a different number of storage circuits 520 between two rows and/or between two columns, the circuitry may only have one row or only one column, address register 550 may be omitted, gearboxes 530 may be omitted, etc.

As shown in FIG. 5, control circuit 510 may direct address register 550 and data register 540 via gearbox 530 to read the state and/or set the state of storage circuits 520. In another embodiment, control circuit 510 may use configuration resources such as address register 550 and data register 540 with gearbox 530 being bypassed to implement a circuit design by programming configuration memory bits (not shown).

Consider the scenario in which control circuit 510 programs configuration memory bits to implement a circuit design. In this scenario, control circuit 510 may receive a packet requesting a write access operation to a frame of configuration memory bits together with configuration data and an address. Control circuit 510 may shift the configuration data into data register 540. Data register 540 may drive data lines directly (e.g., through a tri-state buffer not shown in FIG. 5), thereby bypassing gearbox 530.

Control circuit 510 may shift the address into address register 550, thereby selecting the configuration memory bits that are to be programmed by the configuration data. The address register 550 may enable a write access operation to the selected configuration memory bits (e.g., by enabling pass transistors between the data line and a memory cell), thereby storing the configuration data from the data register 540 via the data line in the configuration memory cells. If desired, control circuit 510 may send a response packet (e.g., to a processor circuit and/or a global control circuit, etc.) indicating the success of the write access operation. If desired, control circuit 510 may indicate in the response packet that it is ready to receive another packet of data.

In some embodiments, control circuit 510 may receive a write access request packet that includes a frame of configuration data for data register 540 with an address that selects a data register controller (not shown) for the purpose of programming configuration memory bits to implement a circuit design. The configuration data may be written by a network-on-chip receiver to the data register controller. The data register controller may shift the configuration data in packets of a predetermined number of bits per cycle into the data register. Upon receipt of the last predetermined number of bits of configuration data, control circuit 510 may direct address register 550 based on the address received with the write access request packet to enable a write access operation from the data line driven by data register 540.

Consider the scenario in which control circuit 510 directs address register 550 and data register 540 via gearbox 530 to perform a write access operation to one of storage circuits 520. For example, control circuit 510 may receive a packet requesting a write access operation. In this example, control circuit 510 may prepare data register 540 and/or address register 550 for a write access operation. For example, control circuit 510 may enable a connection from control circuit 510 to gearboxes 530. If desired, control circuit 510 may send a response packet (e.g., to a processor circuit and/or a global control circuit, etc.) indicating that data register 540 and/or address register 550 were successfully prepared and/or that data register 540 and/or address register 550 are ready to receive user data.

Control circuit 510 may receive a packet of user data requesting a write access operation to a predetermined storage circuit 520 together with user data and an address that designates the predetermined storage circuit 520. As an example, consider the scenario in which storage circuits 520 are arranged in an array of rows and columns as shown in FIG. 5 and that the address indicates a predetermined row and a predetermined column. In this scenario, control circuit 510 may analyze the packet of user data and direct address register 550 and/or data register 540 based on the analysis. For example, address register 550 may assert an enable signal that enables a write access operation to all storage circuits 520 in the predetermined row.

Control circuit 510 may send a portion of the packet of user data to data register 540 and from there to at least one gearbox 530. A gearbox that receives the portion of the packet of user data may determine whether the predetermined column designates the column of storage circuits that are connected to that gearbox. In the event that the predetermined address designates the column connected to the gearbox and thereby designates the gearbox, the designated gearbox 530 may assert the appropriate control signals to enable a write access operation to the storage circuits 520 in the predetermined column. If desired, the designated gearbox 530 may send the data that is to be stored in the predetermined storage circuit 520 over the data lines to the storage circuits in the predetermined column so that the data is stored in the predetermined storage circuit 520.

As an example, the predetermined storage circuit 520 may include a two-dimensional array of storage bits and the write access operation may write data to all storage bits in the predetermined storage circuit. In this example, the designated gearbox 530 may include an address counter that indicates a row of storage bits in the two-dimensional array. In the event of a synchronous write operation, the designated gearbox 530 may start at a first address, write data to the row that corresponds to the first address at a clocking event, and increment the address counter. The designated gearbox 530 may then repeat these steps for all other rows in storage circuit 520.

Consider the scenario in which control circuit 510 directs the configuration resources to perform a read access operation from one of storage circuits 520. For example, control circuit 510 may receive a packet requesting a read access operation. In this example, control circuit 510 may prepare data register 540 and/or address register 550 for a read access operation. For example, control circuit 510 may set data register 540 into shift mode such that the signals read from the storage circuit are shifted into the data register. If desired, control circuit 510 may send a response packet (e.g., to a processor circuit and/or a global control circuit, etc.) indicating that data register 540 and/or address register 550 were successfully prepared and/or that data register 540 and/or address register 550 are ready to perform a read access operation.

Control circuit 510 may receive a packet requesting a read access operation from a predetermined storage circuit 520 together with an address that designates the predetermined storage circuit 520. As an example, consider the scenario in which storage circuits 520 are arranged in an array of rows and columns as shown in FIG. 5 and that the address indicates a predetermined row and a predetermined column. In this scenario, control circuit 510 may analyze the packet and direct address register 550 and/or data register 540 based on the analysis. For example, address register 550 may assert an enable signal that enables a read access operation at all storage circuits 520 in the predetermined row.

Control circuit 510 may send a portion of the packet to data register 540 and from there to at least one gearbox 530. A gearbox that receives the portion of the packet may determine whether the predetermined column designates the column of storage circuits that are connected to that gearbox. In the event that the predetermined address designates the column connected to the gearbox and thereby designates the gearbox, the designated gearbox 530 may assert the appropriate control signals to enable a read access operation at the storage circuits 520 in the predetermined column.

As an example, the predetermined storage circuit 520 may include a two-dimensional array of storage bits and the read access operation may read data from all storage bits in the predetermined storage circuit. In this example, the designated gearbox 530 may include an address counter that indicates a row of storage bits in the two-dimensional array. In the event of a synchronous read operation, the designated gearbox 530 may start at a first address, read data from the row that corresponds to the first address at a clocking event, and increment the address counter. The designated gearbox 530 may then repeat these steps for all other rows in storage circuit 520.

As an example, for the purpose of reading one storage bit in a row that corresponds to the first address, the designated gearbox 530 may pre-charge the data lines to the storage bits in the column of the predetermined storage circuit 520 so that a sense amplifier may detect the bit value stored in the corresponding storage bit.

If desired, the designated gearbox may eliminate bit values retrieved from storage bits of the predetermined storage circuit 520. For example, consider the scenario in which a row of the predetermined storage circuit stores up to 40 bits with eight bits being used for error correction coding. In this scenario, the designated gearbox may eliminate the eight error correction code bits and only shift the 32 remaining user bits into data register 540.

Figure 6:
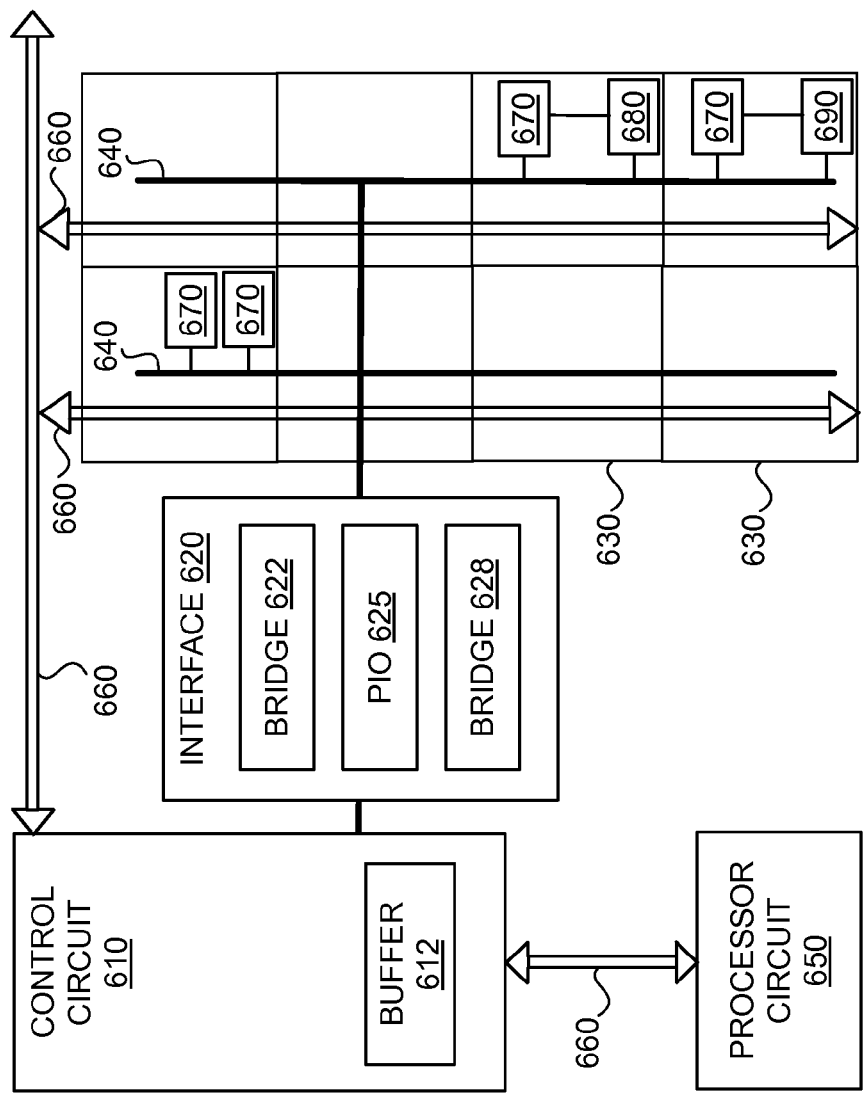
FIG. 6 is a diagram of an illustrative system with a control circuit that communicates with a processor circuit and that performs access operations to storage circuits in an integrated circuit via configuration resources and an interface in accordance with an embodiment.

In certain embodiments, a control circuit may access storage circuits via interconnect resources that are used during the execution of the application and through an interface between the control circuit and the interconnect resources. FIG. 6 is a diagram of an illustrative integrated circuit that may include control circuit 610 with buffer 612. Control circuit 610 may communicate with processor circuit 650 and perform access operations to storage circuits 670 in an integrated circuit via configuration resources 660 and an interface 620 that couples control circuit 610 to interconnect resources 640.

As shown in FIG. 6, a portion of the integrated circuit may be divided into partitions 630. Partitions 630 may include storage circuits 670, arithmetic circuits 680, additional processor circuits 690, etc. If desired, partitions 630 may include logic resources such as logic array blocks, which may include logic elements, configurable logic blocks, adaptive logic modules, just to name a few. If desired, control circuit 610 may implement a circuit design in partitions 630. For example, control circuit 610 may generate a circuit design implementation in partitions 630 by programming configuration memory bits via configuration resources 660.

Interconnect resources 640 may couple storage circuits 670, arithmetic circuits 680, additional processor circuits 690, logic resources in partitions 630, and interface 620. If desired, interconnect resources 640 may provide configurable connections (e.g., by programming configuration memory blocks that enable connections between vertical wires and horizontal wires). For example, interconnect resources 640 may be configured by control circuit 610 to implement a circuit design in partitions 630. In some embodiments, interconnect resources 640 may provide fixed connections between predetermined circuits of a circuit design implementation with the integrated circuit.

In certain embodiments, interface 620 may include a bridge circuit such as bridge 622 from control circuit 610 to interconnect resources 640. As an example, bridge 622 may implement a memory-mapped bus architecture, which may allow masters in control circuit 610 to access slaves implemented by logic resources in partitions 630, and thereby access interconnect resources 640. If desired, interface 620 may include a parallel input-output (PIO) component such as PIO 625, which may allow control circuit 610 to access signals in logic resources in partitions 630. A master may control signals through PIO 625 by reading and writing memory-mapped registers. PIO 625 may capture data on its inputs and drive data to its outputs. If desired, control circuit 610 may program an input-output port of PIO 625 as an input or output.

In some embodiments, interface 620 may include a bridge circuit such as bridge 628 from interconnect resources 640 to control circuit 610. As an example, bridge 628 may implement a memory-mapped bus architecture, which may allow logic resources in partitions 630 to be a master that accesses slaves in control circuit 610. If desired, the logic resources in partitions 630 may operate in a different clock domain than control circuit 610, and bridge 628 may include dual clock first-in first-out (FIFO) cores to transfer data from one clock domain to the other clock domain.

In some scenarios, it may be desirable to send a signal from control circuit 610 through interface 620 and interconnect resources 640 to storage circuits 670. As an example, consider the scenario in which a global signal needs to be sent to storage circuits 670. Such a reset signal may require that many connections of interconnect resources 640 couple a circuit that generates the reset signal to storage circuits 670 in a circuit design implementation. In some embodiments, the circuit that generates the reset signal may send it to processor circuit 650. In response to receiving the reset signal, processor circuit 650 may send a signal over configuration resources 660 to control circuit 610, and control circuit 610 may send the signal via interface 620 and interconnect resources 640 to storage circuits 670. Storage circuits 670 may reset upon reception of the signal. If desired, processor circuit 650 and/or control circuit 610 may calibrate a clock signal over a clock network to effect a locally synchronous reset removal at storage circuits 670.

Other scenarios in which control circuit 610 may write data to storage circuits 670 via interface 620 and interconnect resources 640 include the instantiation of circuitry, the parameterization of circuitry, the modification of circuitry, just to name a few. In certain embodiments, a control circuit such as local control circuit 410 of FIG. 4 may use scan chain 450 to write data to registers as described in FIG. 3 for the purpose of instantiating circuitry, parameterizing circuitry, modifying circuitry, etc.

For example, arithmetic circuit 680 may implement a finite impulse response (FIR) filter and storage circuit 670 may store coefficients of the FIR filter. In this example, control circuit 610 may write the coefficients to storage circuit 670 via interface 620 and interconnect resources 640. During operation of the FIR filter, arithmetic circuit 680 may access the coefficients stored in storage circuit 670 via interconnect resources 640.

In another example, processor circuit 690 may use storage circuit 670 as an instruction memory. In this example, control circuit 610 may write instructions to storage circuit 670 via interface 620 and interconnect resources 640 to initialize the instruction memory and/or update the instruction memory of processor circuit 690.

In another example, the data stored in a storage circuit may select between 8 bit 10 bit (8b/10b) encoding and 64 bit 66 bit (64b/66b) encoding in a high speed serial communication circuit. Control circuit 610 of FIG. 6 or local control circuit 410 of FIG. 4 may perform write access operations to storage circuits as described in FIGS. 4 and 6, thereby instantiating the implementation of the high speed serial communication circuit and saving configuration resources.

In another example, storage circuit 670 may be a random-access memory (RAM) circuit that implements a read-only memory (ROM) circuit. In this example, control circuit 610 may write data to storage circuit 670 via interface 620 and interconnect resources 640 to initialize the contents of the ROM circuit.

In another example, storage circuit 670 or registers 320A and 320B may implement states of a finite state machine (FSM). In this example, control circuit 610 may write data to storage circuit 670 via interface 620 and interconnect resources 640 to set the finite state machine into an initial state.

In some scenarios, it may be desirable to retrieve a signal from storage circuits 670 through interconnect resources 640 and interface 620. As an example, consider the scenario in which the operation of an integrated circuit is monitored to detect errors, and storage circuits such as registers 320A and 320B of FIG. 3 and/or storage circuits 670 of FIG. 6 store error conditions. In some applications, it may be desirable to retrieve the error conditions stored in those storage circuits and probe additional signals based on observed error conditions. Control circuits such as local control circuit 410 of FIG. 4 may perform read access operations to registers via scan chains as described in FIGS. 3 and 4 to retrieve error conditions. If desired, control circuit 610 of FIG. 6 may perform a read access operation to retrieve error conditions from storage circuits 670 via interface 620 and interconnect resources 640.

In some embodiments, a trace buffer may store the data retrieved from one or more of storage circuits 670 to allow for data analysis at a later point in time. Buffer 612 of control circuit 610 may implement the trace buffer. Alternatively, control circuit 610 may configure a storage circuit 670 as a trace buffer. Buffer 612 and/or storage circuit 670 may store the data until processor circuit 650 requests the data. Upon receipt of such a request, control circuit 610 may send the data over configuration resources 660 to processor circuit 650.

If desired, control circuit 610 may perform a read access operation at storage circuits 670 and route the retrieved data directly to processor circuit 650 via interconnect resources 640, interface 620, and configuration resources 660, thereby bypassing buffer 612. In certain embodiments, arithmetic circuit 680 may implement a counter. The counter may count the number of observed errors, the incidence of a given state of a finite state machine (FSM), etc. Control circuit 610 may retrieve the number stored in the counter by performing a read access operation to arithmetic circuit 680.

A control circuit (e.g., global control circuit 210 of FIG. 2, local control circuit 410 of FIG. 4, control circuit 510 of FIG. 5, or control circuit 610 of FIG. 6) may monitor a circuit design implementation for the occurrence of an error condition. For example, the control circuit may receive a signal that indicates the occurrence of an error condition. Upon detection of an error condition, the control circuit may perform several actions. For example, the control circuit may stop the clock signal and perform a read access operation at substantially all storage circuits of the circuit design implementation. The control circuit may stop writing to the trace buffer and provide the data stored in the trace buffer via interconnect (e.g., communications network 230 of FIG. 2, data register 540 of FIG. 5, configuration resources 660 of FIG. 6) for further processing, for example to user interface 250 of FIG. 2 or processor circuit 650 of FIG. 6. If desired, the control circuit may notify a user of the occurrence of an error condition.

In some embodiments, a control circuit (e.g., global control circuit 210 of FIG. 2, local control circuit 410 of FIG. 4, control circuit 510 of FIG. 5, or control circuit 610 of FIG. 6) may perform a write access operation at storage circuits (e.g., registers 320A and 320B of FIG. 3, storage circuits in circuit blocks 430 of FIG. 4, storage circuits 520 of FIG. 5, or storage circuits 670 of FIG. 6) for fault injection (e.g., to model and analyze the effect of a single event upset (SEU)). For example, the control circuit may interrupt the operation of at least a portion of a circuit design implementation. The control circuit may perform a read access operation at a storage circuit to retrieve a bit stored in the storage circuit. The control circuit may invert the bit value of the retrieved bit, perform a write access operation at the storage circuit to store the inverted bit value in the storage circuit and restart operation of the interrupted portion of the circuit design implementation. Consider the scenario in which the integrated circuit is programmable logic device 100 of FIG. 1 and the circuit design implementation is a mapping of a user's circuit design onto programmable logic device 100 with the storage circuit being a user register in the circuit design implementation. In this scenario, the control circuit may perform a write access operation at the user register and invert the bit value of the bit stored in the user register.

The effect of the injected fault may be observed at an output of the integrated circuit. If desired, two identical circuit designs may be implemented in the same integrated circuit or in two separate integrated circuits. The two circuit design implementations may receive the same input data. The control circuit may inject the fault into one of the two circuit design implementations and observe differences at outputs of the two circuit design implementations to monitor the effect of the injected fault.

Figure 7:
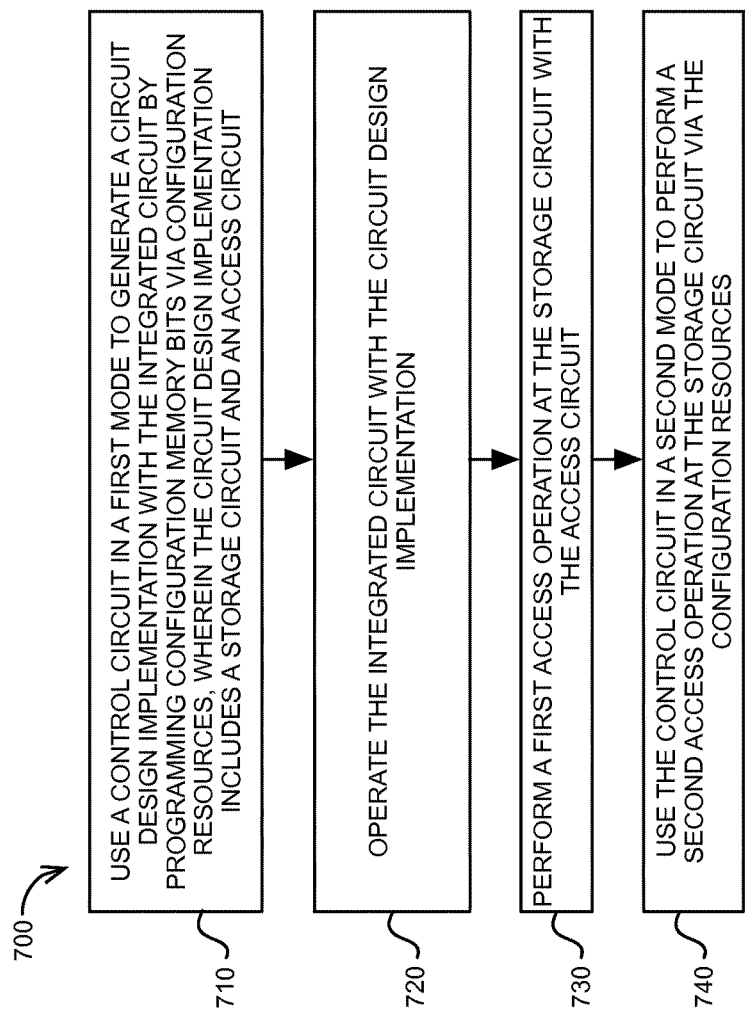
FIG. 7 is a flow chart showing illustrative operations for performing access operations to storage circuits via configuration resources in an integrated circuit in accordance with an embodiment.

FIG. 7 is a flow chart 700 showing illustrative operations for performing access operations to storage circuits (e.g., storage circuits in sectors 240 of FIG. 2, storage circuits 520 of FIG. 5, or storage circuits 670 of FIG. 6) via configuration resources (e.g., communication network 230 of FIG. 2, data register 540 and address register 550 of FIG. 5, configuration resources 660 of FIG. 6) in an integrated circuit. During operation 710, a control circuit in a first mode may generate a circuit design implementation that includes a storage circuit and an access circuit with the integrated circuit by programming configuration memory bits via configuration resources. The control circuit may disable a clock signal during the programming of configuration memory bits. If desired, the control circuit may program the configuration memory bits without disabling the clock signal.

For example, global control circuit 210 of FIG. 2 may send configuration data via communications network 230 to local control circuits 220, which may implement the circuit design in sectors 240. As another example, control circuit 510 of FIG. 5 may configure storage circuits 520 via address register 550 and data register 540. As another example, processor circuit 650 of FIG. 6 may send configuration data via configuration resources 660 to control circuit 610, which may implement the circuit design in partitions 630 by programming configuration memory bits.

During operation 720, the integrated circuit with the circuit design implementation may operate in user mode, and during operation 730, a first access operation may be performed at the storage circuit with the access circuit. As an example, arithmetic circuit 680 may perform a read access operation at storage circuit 670 to retrieve coefficients for a finite impulse response (FIR) filter operation. In some embodiments, the access circuit may include functional blocks such as logic array blocks (LABs) 110, random access memory (RAM) blocks 130, and/or digital signal processing (DSP) blocks 120 of PLD 100 of FIG. 1 that may be configured to perform access operations at the storage circuit.

During operation 740, the control circuit in a second mode may perform a second access operation at the storage circuit via the configuration resources. For example, control circuit 610 may perform read and/or write access operations of storage circuits 670 using configuration resources 660. Similarly, global control circuit 210 of FIG. 2 may access storage circuits in sectors 240 using communication network 230. Also, control circuit 510 may access storage circuits 520 using data register 540 and address register 550.

Figure 8:
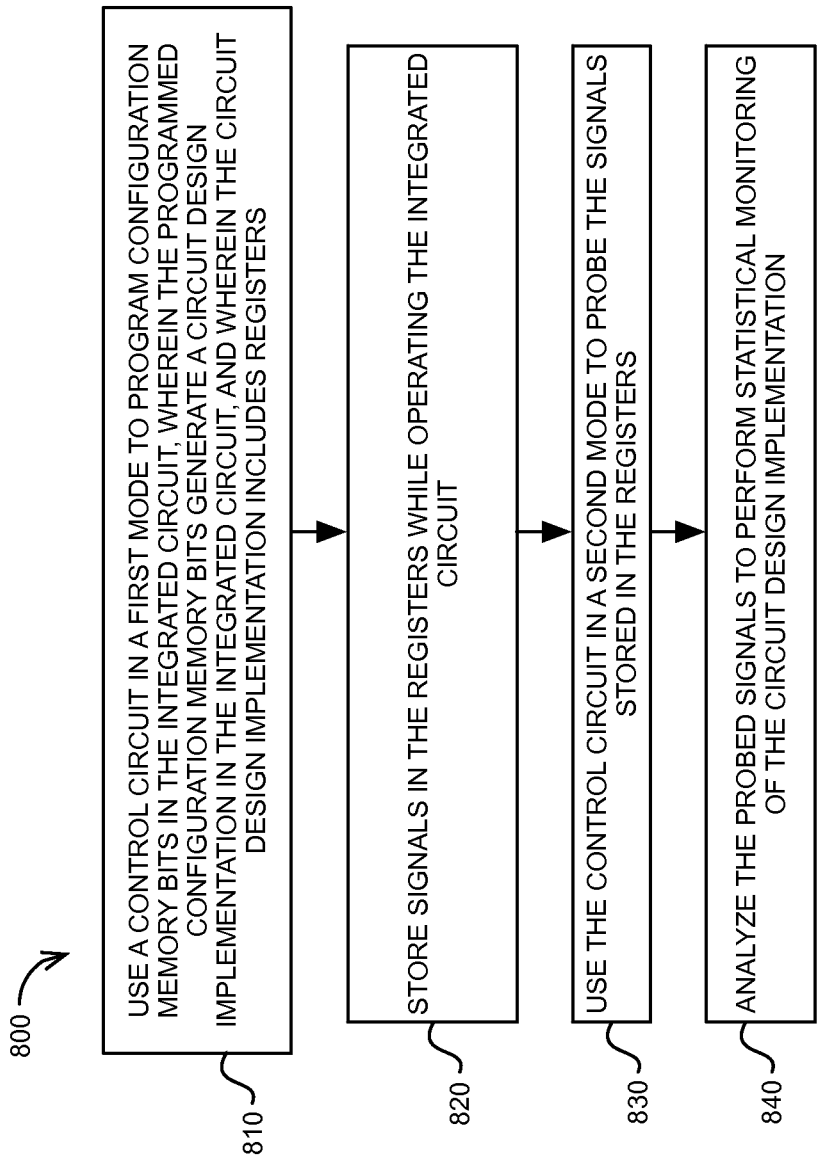
FIG. 8 is a flow chart showing illustrative operations for performing statistical monitoring of a circuit design implementation in an integrated circuit in accordance with an embodiment.

FIG. 8 is a flow chart 800 showing illustrative operations for performing statistical monitoring of a circuit design implementation in an integrated circuit. During operation 810, a control circuit in a first mode may program configuration memory bits in an integrated circuit, thereby generating a circuit design implementation that includes registers in the integrated circuit. During operation 820, the circuit design implementation may store signals in the registers while operating the integrated circuit. During operation 830, the control circuit in a second mode may probe the signals stored in the registers. For example, the control circuit may probe the signals stored in the registers in the second mode using one or more scan chains as disclosed herein with respect to FIGS. 3 and 4. As a specific example, control circuit 410 may probe signals stored in user registers in sector 400 using scan chain 450 as disclosed herein with respect to FIG. 4. As another specific example, a local control circuit 220 may probe signals stored in user registers 320A-320B using the scan chain that includes storage circuits 340 and 345 as disclosed herein with respect to FIG. 3. The probed signals may be analyzed to perform statistical monitoring (e.g., count the number of error states such as overflow in a microprocessor, count corrupt packages in a traffic manager circuit, etc.) of the circuit design implementation during operation 840. The probed signals may be analyzed in operation 840 to perform the statistical monitoring using, for example, the control circuit.

The methods and apparatuses described herein may be incorporated into any suitable electronic device or system of electronic devices. For example, the methods and apparatuses may be incorporated into numerous types of devices such as microprocessors or other integrated circuits (ICs). Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), coarse-grained programmable logic devices (CGPLDs), coarse-grained reconfigurable arrays (CGRAs), application specific standard products (ASSPs), application specific integrated circuits (ASICs), digital signal processors (DSPs), graphics processing units (GPUs), just to name a few.

The integrated circuits described herein may be part of a data processing system that includes one or more of the following components; a processor; memory; I/O circuitry; and peripheral devices. The integrated circuits can be used in a wide variety of applications, such as computer networking, data networking, instrumentation, video processing, digital signal processing, or any suitable other application where the advantage of performing read and/or write access operations at storage circuits is desirable.

Although the method operations were described in a specific order, it should be understood that other operations may be performed in between described operations, described operations may be adjusted so that they occur at slightly different times or described operations may be distributed in a system that allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for accessing a storage circuit in an integrated circuit, the method comprising:
using a control circuit in a first mode to generate a circuit design implementation with the integrated circuit by programming configuration memory bits via configuration resources, wherein the circuit design implementation includes a storage circuit and an access circuit;
operating the integrated circuit with the circuit design implementation;
performing a first access operation at the storage circuit with the access circuit; and
using the control circuit in a second mode to perform a second access operation at the storage circuit via the configuration resources.

2. The method of claim 1, wherein the configuration resources include an address register, wherein information stored in the address register selects at least one configuration memory bit of the configuration memory bits for programming, wherein the configuration resources further include a data register, and wherein the data register stores a signal that is stored in the at least one configuration memory bit.

3. The method of claim 1, wherein the configuration resources include a data register controller coupled to a first data register and a second data register, wherein the data register controller receives data signals from the control circuit and sends the data signals to the first data register or the second data register based on the data signals.

4. The method of claim 1, wherein the second access operation is a write operation.

5. The method of claim 4, wherein the write operation further comprises:
injecting a fault into the circuit design implementation by inverting a bit in the storage circuit; and
observing an output of the integrated circuit to examine whether the fault affects the output.

6. The method of claim 5, wherein the write operation further comprises:
receiving a reset signal at the control circuit;
performing an interrupt operation at the control circuit upon reception of the reset signal; and
sending a reset request signal from the control circuit to a sector via the configuration resources, wherein the reset request signal requests performing a reset operation in the sector.

7. The method of claim 5, wherein the write operation further comprises:
initializing the storage circuit to a predetermined state at power-up.

8. The method of claim 1, wherein the second access operation is a read operation that retrieves a signal from the storage circuit.

9. The method of claim 8, further comprising:
identifying a state of a finite state machine based on the signal; and
increasing a counter to count occurrences of the state.

10. A method for performing statistical monitoring of a circuit design implementation in an integrated circuit, the method comprising:
using a control circuit in a first mode to program configuration memory bits in the integrated circuit, wherein the programmed configuration memory bits generate the circuit design implementation in the integrated circuit, and wherein the circuit design implementation includes registers;
storing signals in the registers while operating the integrated circuit;
using the control circuit in a second mode to probe the signals stored in the registers; and analyzing the probed signals to perform statistical monitoring of the circuit design implementation.

11. The method of claim 10, wherein the signals stored in the registers represent error conditions.

12. The method of claim 10, wherein the signals stored in the registers represent a state of a finite state machine.

13. The method of claim 12, wherein the analyzing the probed signals further comprises:
counting occurrences of the state by using a counter to increase a number of occurrences of the state by one.

14. The method of claim 10, wherein the using the control circuit in a second mode further comprises:
using configuration resources to route the probed signals from the registers to an output of the integrated circuit.

15. The method of claim 14, further comprising:
storing the probed signals in a buffer that is coupled between the registers and the output of the integrated circuit; and
sending the probed signals from the buffer to the output of the integrated circuit based on a trigger signal from the control circuit.

16. Circuitry comprising:
configuration resources;
a control circuit coupled to the configuration resources, wherein the control circuit receives a signal via the configuration resources, and wherein the control circuit performs a write access operation to store data in a storage circuit in response to the signal;
configuration memory elements that configure interconnect resources to implement a path to the storage circuit; and
an interface circuit between the control circuit and the interconnect resources, wherein the control circuit sends the data via the interface circuit and the path through the interconnect resources to the storage circuit, and wherein the storage circuit stores the data during the write access operation.

17. The circuitry of claim 16, further comprising:
a processor circuit coupled to the configuration resources, wherein the processor circuit receives a reset signal, generates the signal based on the received reset signal, and sends the signal via the configuration resources to the control circuit.

18. The circuitry of claim 17, further comprising:
a clock network that conveys a clock signal that synchronizes the storage circuit, wherein the processor circuit calibrates the clock signal to effect a locally synchronous reset removal at the storage circuit, and wherein the interface circuit comprises a bridge circuit that implements a memory-mapped bus.

19. The circuitry of claim 16, further comprising:
a multiplier circuit that implements at least a portion of a finite impulse response (FIR) filter operation and wherein the data stored in the storage circuit comprises a coefficient for the FIR filter operation.

20. The circuitry of claim 16, further comprising:
a processor circuit that is coupled to the storage circuit, wherein the storage circuit stores at least a portion of an instruction of the processor circuit, and wherein the write access operation initializes the at least a portion of the instruction in the storage circuit.

* * * * *